(12) United States Patent
Wei et al.

(10) Patent No.: US 8,753,940 B1
(45) Date of Patent: Jun. 17, 2014

(54) METHODS OF FORMING ISOLATION STRUCTURES AND FINS ON A FINFET SEMICONDUCTOR DEVICE

(71) Applicant: Globalfoundries Inc., Grand Cayman (KY)

(72) Inventors: Andy C. Wei, Queensbury, NY (US); Dae Geun Yang, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/834,410

(22) Filed: Mar. 15, 2013

(51) Int. Cl.
*H01L 21/336* (2006.01)

(52) U.S. Cl.
USPC ..... 438/283; 438/284; 438/587; 257/E21.429

(58) Field of Classification Search
USPC .................. 438/585, 587, 589, 283–284; 257/E21.429
See application file for complete search history.

(56) References Cited

U.S. PATENT DOCUMENTS

| 6,872,647 | B1 * | 3/2005 | Yu et al. | 438/585 |
| 8,021,942 | B2 * | 9/2011 | Wei et al. | 438/216 |
| 8,569,125 | B2 * | 10/2013 | Standaert et al. | 438/197 |
| 8,617,996 | B1 * | 12/2013 | Chi et al. | 438/700 |
| 2013/0065326 | A1 * | 3/2013 | Sudo | 438/3 |
| 2013/0196478 | A1 * | 8/2013 | Chang et al. | 438/283 |
| 2014/0001562 | A1 * | 1/2014 | Liaw | 257/369 |

* cited by examiner

*Primary Examiner* — Matthew W Such
*Assistant Examiner* — Ali Naraghi
(74) *Attorney, Agent, or Firm* — Amerson Law Firm, PLLC

(57) ABSTRACT

One method includes forming a plurality of trenches in a semiconducting substrate to define a plurality of fins, forming a layer of overfill material that overfills the trenches, wherein an upper surface of the overfill material is positioned above an upper surface of the fins, forming a masking layer above the layer of overfill material, wherein the masking layer has an opening that is positioned above a subset of the plurality of fins that is desired to be removed and wherein the subset of fins is comprised of at least one but less than all of the fins, performing an etching process through the masking layer to remove at least a portion of the layer of overfill material and expose the upper surface of the subset of fins, and performing a second etching process on the exposed surface of the subset of fins to remove the subset of fins.

13 Claims, 14 Drawing Sheets

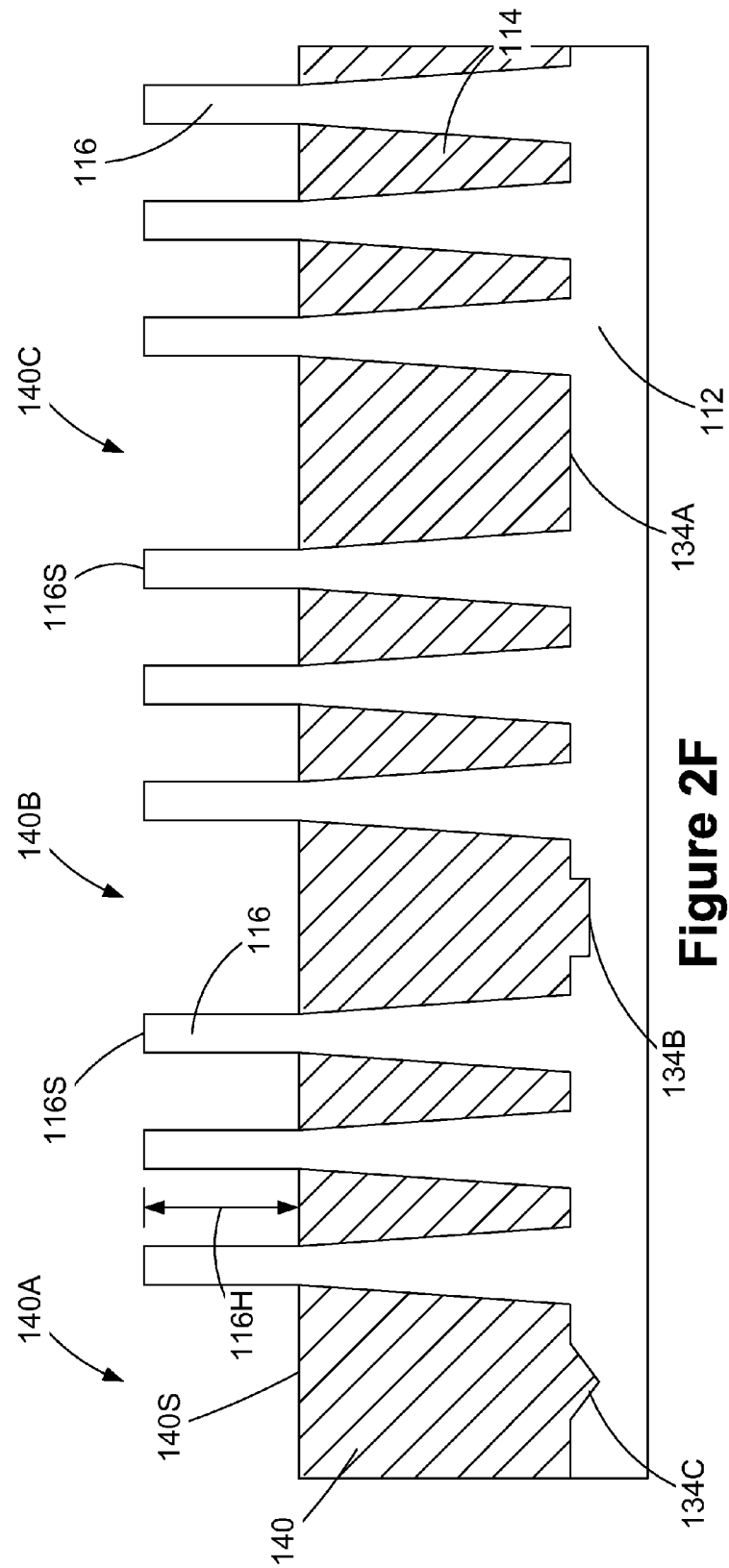

METHODS OF FORMING ISOLATION STRUCTURES AND FINS ON A FINFET SEMICONDUCTOR DEVICE

BACKGROUND OF THE INVENTION

1. Field of the Invention

Generally, the present disclosure relates to the manufacturing of sophisticated semiconductor devices, and, more specifically, to various methods of forming isolation structures and fins on a FinFET semiconductor device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a three-dimensional structure. More specifically, in a FinFET, a generally vertically positioned, fin-shaped active area is formed and a gate electrode encloses both of the sides and the upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the depletion width under the channel and thereby reduce so-called short channel effects. Also, in a FinFET, the junction capacitance at the drain region of the device is greatly reduced, which tends to reduce at least some short channel effects.

Both FET and FinFET semiconductor devices have an isolation structure, e.g., a shallow trench isolation structure, that is formed in the semiconducting substrate around the device so as to electrically isolate the semiconductor device. FIGS. 1A-1D depict various illustrative problems that may be encountered in forming isolation structures on FinFET semiconductor devices. In general, as shown in FIG. 1A, formation of the fins 16 for a FinFET device 10 involves etching a plurality of trenches 14 in a semiconducting substrate 12 that essentially define the fins 16. The etching process is generally performed through a patterned hard mask layer 18 that may be comprised of a layer of silicon nitride 18A and a layer of silicon dioxide 18B.

As FinFET devices 10 have been scaled to meet ever increasing performance and size requirements, the width 16W of the fins 16 has become very small, e.g., 6-12 nm, and the fin pitch 16P has also been significantly decreased, e.g., the fin pitch 16P may be on the order of about 30-60 nm. Traditionally, isolation structures were always the first structure that was formed when manufacturing semiconductor devices. The isolation structures were formed by etching the trenches for the isolation structures and thereafter filling the trenches with the desired insulating material, e.g., silicon dioxide. After the isolation structures were formed, various process operations were performed to manufacture the semiconductor device. In the case of a FinFET device, this involved masking the previously formed isolation structure and etching the trenches in the substrate that defined the fins.

However, as the dimensions of the fins became smaller, problems arose with manufacturing the isolation structures before the fins were formed. As one example, trying to accurately define very small fins in regions that were separated by relatively large isolation regions was difficult due to the non-uniform spacing between various structures on the substrate. One manufacturing technique that is employed in manufacturing FinFET devices is to initially form a so-called "sea-of-fins" across the substrate, and thereafter remove some of the fins where larger isolation structures will be formed. FIG. 1A depicts an illustrative FinFET device 10 that is at the point of fabrication where the "sea-of-fins" has been initially formed in the substrate 12. Using this "sea-of-fins" type manufacturing approach, better accuracy and repeatability may be achieved in forming the fins 16 to very small dimensions due to the more uniform environment in which the etching process that forms the trenches 14 is performed. In the example depicted in FIGS. 1A-1B, the fins 16 all have a single uniform spacing. However, in a real-world device, the fins 16 may be formed so as to have various regions with different spacing or fin pitches 16P.

After the "sea-of-fins" has been formed, some of the fins 16 must be removed to create room for or define the spaces where isolation regions will ultimately be formed. FIG. 1B depicts the device 10 after several process operations have been formed. Initially, an optical planarization layer (OPL) 23 is formed so as to overfill the trenches 14. Thereafter, an anti-reflective coating layer (ARC) 24 is formed above the OPL layer 23 and a patterned mask layer 26, e.g., a patterned photoresist mask, is formed above the ARC layer 24. The mask layer 26 has a plurality of openings 26A-26C positioned above various fins 16 to be removed. In the depicted example, only a single fin will be removed to make room for the isolation region. However, as will be recognized by those skilled in the art, depending upon the desired final size of the isolation region, more than one fin 16 may be removed. The ARC layer 24 may be comprised of a variety of materials, such as, for example, silicon nitride, silicon oxynitride, silicon or carbon containing organic polymers, etc.

In some cases, with very tight fin pitches, the lithography and etching processes that are performed to define the trenches 14 in the substrate 12 may introduce variables that can lead to damaged fins 16. For example, in FIG. 1B, the openings 26B-26C have a dimension 28 that is precisely as intended by the design process, whereas the opening 26A has a dimension 30 that is greater than that of dimension 28. The variations in the dimensions 28, 30 may be due to acceptable process variations in the lithography operations that are performed to make the patterned mask layer 26. Overlay errors in attempts to properly locate the openings 26A-26C may also lead to problems that may cause fin damage when the trenches 14 are formed.

The trench etching process that is performed to form the trenches 14 should be non-selective in nature, i.e., the etchants used may consume the litho film material (such as the OPL layer 23) and the fins 16. The trench etching process may also introduce undesirable process variations in the size of the openings that are formed through the ARC layer 24 and the OPL layer 23 to remove the fins 16 under the openings 26A-26C. In FIG. 1B, the dashed line 32 depicts the idealized pattern of the opening that will be formed in removing the selected fins 16. The dashed line 34 depicts the situation where, due to variations in the etching process, the openings are wider than desired. In the case where the openings that will be formed to remove a selected number of fins 16 is too large, the fins 16 that will become part of the final FinFET device 10 may become damaged. For example, in the dashed line region 36, an undesirably wide opening in the OPL layer 23 and the ARC layer 24, as reflected by the dashed line 34, may actually consume some of the fin 16.

FIGS. 1C-1D depict an illustrative example wherein a FinFET device 10 will be formed above an SOI (silicon-on-insulator) structure 40. In general, the SOI structure 40 is comprised of a bulk semiconducting substrate 40A, a buried insulation layer 40B ("BOX" layer) and an active layer 40C comprised of a semiconducting material. In general, the fins 16 will be formed in the active region 40C above the buried insulation layer 40B. FIG. 1C depicts the device 10 at the point where the "sea-of-fins" 16 have been formed, and the OPL layer 23, the ARC layer 24 and the patterned mask layer 26 have been formed above the fins 16. Also depicted in FIG. 1C are dashed lines 32 that depict the idealized location of the openings that will be formed in removing the selected fins 16. One problem encountered when removing some of the fins 16 positioned above the buried insulation layer 40B, is that the non-selective, fin-removal etching process that is performed to remove the ARC layer 24, the OPL layer 23 and the fin 16 may consume some of the buried insulation layer 40B in the regions enclosed by dashed lines 35. FIG. 1D depicts the device 10 after the non-selective, fin-removal process has been performed to define the openings 36 and thereby remove the selected fins 16. Eventually, isolation regions (not shown) will be formed in the openings 36. As can be seen in FIG. 1D, the non-selective, fin-removal etching process undesirably consumed some of the buried insulation layer 40B. This gouging of the buried insulation layer 40B can lead to undesirable gate-to-gate shorts when the gates are filled with a metal material.

In the examples shown in FIGS. 1A-1D, the methods involved formation of the OPL layer 23 and the ARC layer 24. However, there are other materials that may be more desirable to use during the fin removal process due to differences in etch selectivity. For example, the OPL layer 23 may be replaced with a layer of amorphous or spin-on carbon, which typically does not require the use of an ARC layer. However, when an amorphous carbon or spin-on glass material is used, a protection layer of, for example, silicon oxynitride is typically formed above the amorphous carbon or spin-on carbon material to provide a means to re-work the wafer in situations where there was an error in forming the patterned mask layer 26. In another material combination, the OPL layer 23 and the ARC layer 24 may be replaced with a DUO material that has anti-reflective coating type properties due to the manner in which it manufactured. Yet another material combination that has been employed involves replacing the OPL layer 23 with a spin-on-glass (SOG) material. The ARC layer 24 would also be employed with the SOG material.

The present disclosure is directed to various methods of forming isolation structures and fins on a FinFET semiconductor device that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming isolation structures and fins on a FinFET semiconductor device. One illustrative method disclosed herein includes forming a plurality of trenches in a semiconducting substrate to thereby define a plurality of fins, forming a layer of overfill material that overfills the trenches, wherein an upper surface of the overfill material is positioned above an upper surface of the fins, forming a masking layer above the layer of overfill material, wherein the masking layer has an opening that is positioned above a subset of the plurality of fins that is desired to be removed, wherein the subset of fins is comprised of at least one but less than all of the plurality of fins, performing at least one first etching process through the masking layer to remove at least a portion of the layer of overfill material and thereby expose the upper surface of the subset of fins, and performing at least one second etching process on the exposed surface of the subset of fins to remove the subset of fins.

Another illustrative method includes forming a plurality of trenches in a semiconducting substrate to thereby define a plurality of fins, forming a layer of overfill material comprised of a DUO™ 248 or DUO™ 193 material that overfills the trenches, wherein an upper surface of the overfill material is positioned above the upper surface of the fins, forming a masking layer on the layer of overfill material, wherein the masking layer has an opening that is positioned above a subset of the plurality of fins that is desired to be removed, wherein the subset of fins is comprised of at least one but less than all of the plurality of fins, performing at least one first etching process through the masking layer to remove at least a portion of the layer of overfill material and thereby expose the upper surface of the subset of fins, and performing at least one second etching process on the exposed surface of the subset of fins to remove the subset of fins.

BRIEF DESCRIPTION OF THE DRAWINGS

The disclosure may be understood by reference to the following description taken in conjunction with the accompanying drawings, in which like reference numerals identify like elements, and in which:

FIGS. 2A-2F depict one illustrative embodiment of a method disclosed herein of forming isolation structures and fins on a FinFET semiconductor device that is formed on a bulk semiconducting substrate.

Figure 1A:
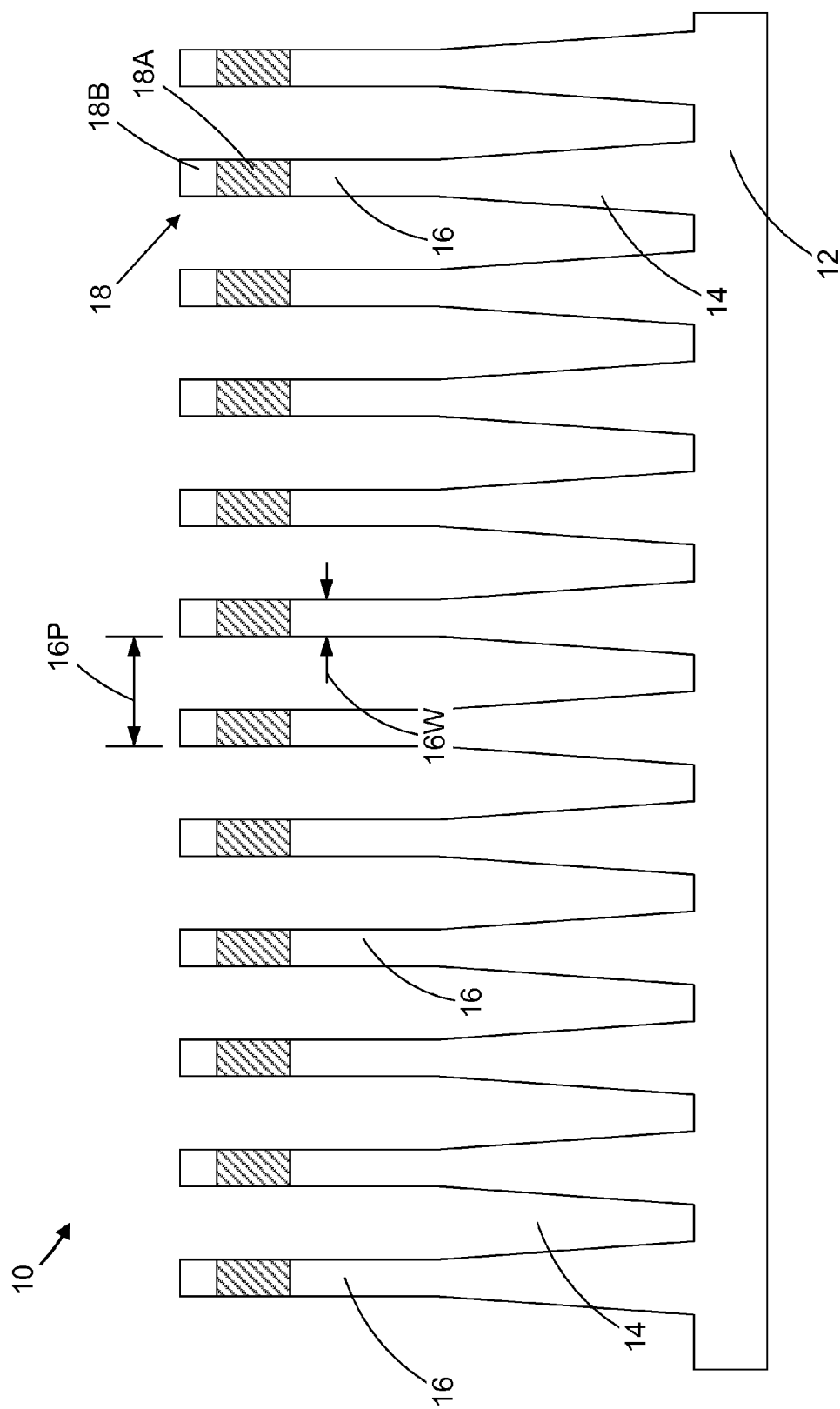
FIGS. 1A-1D depict various illustrative problems that may be encountered in forming isolation structures on FinFET semiconductor devices.
Figure 1B:
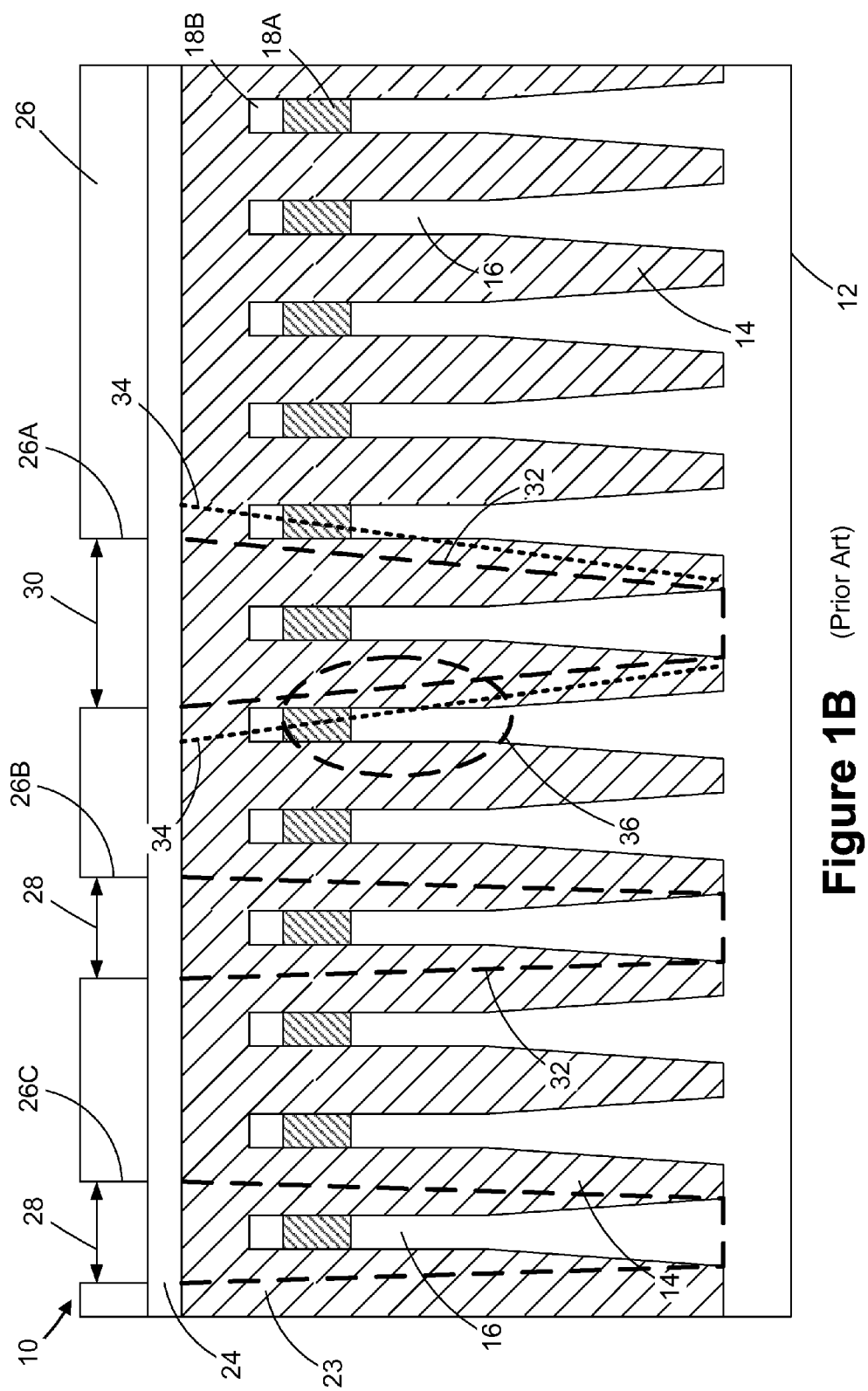
Figure 1C:
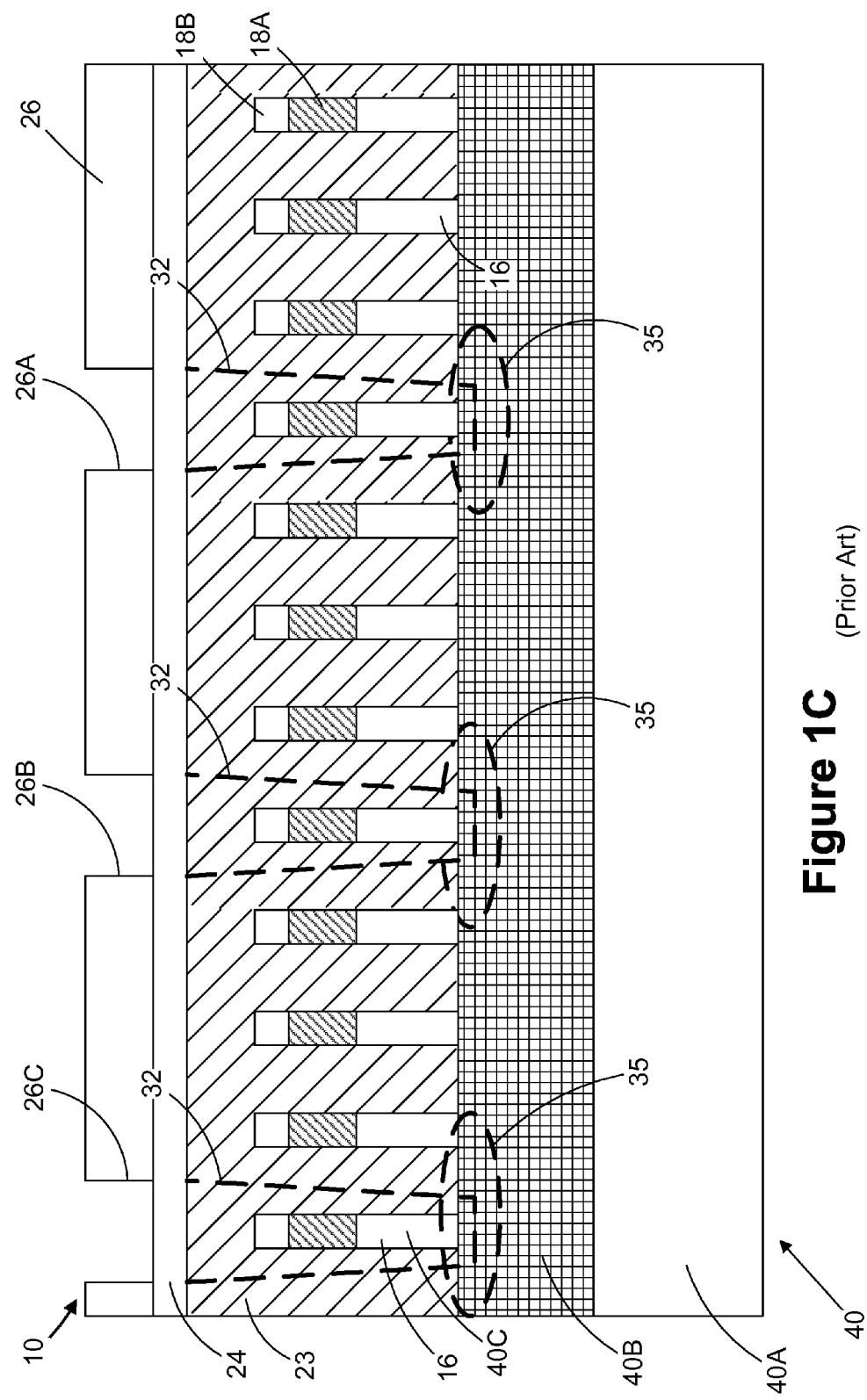
Figure 1D:
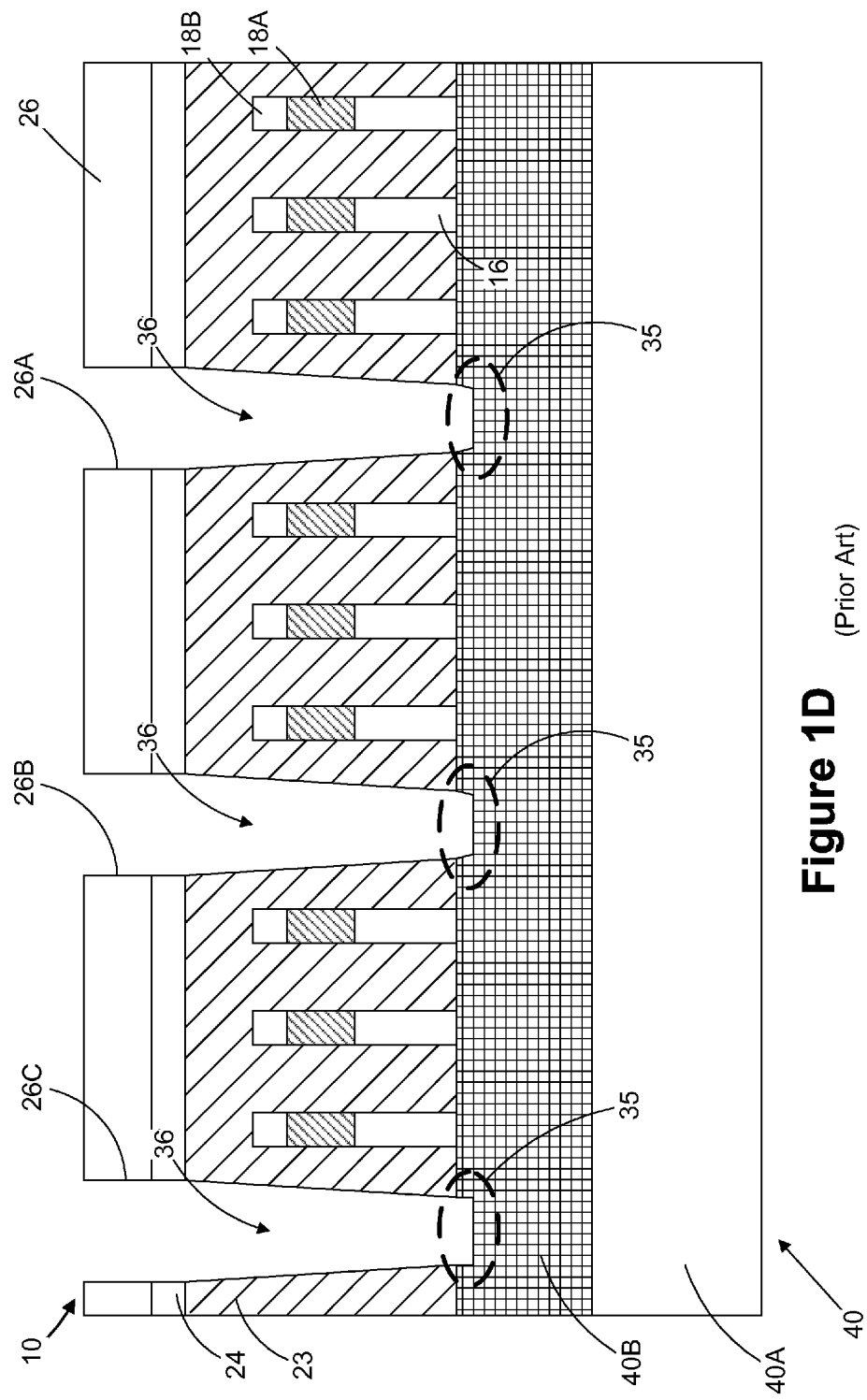

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a FinFET semiconductor device. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

Figure 2A:
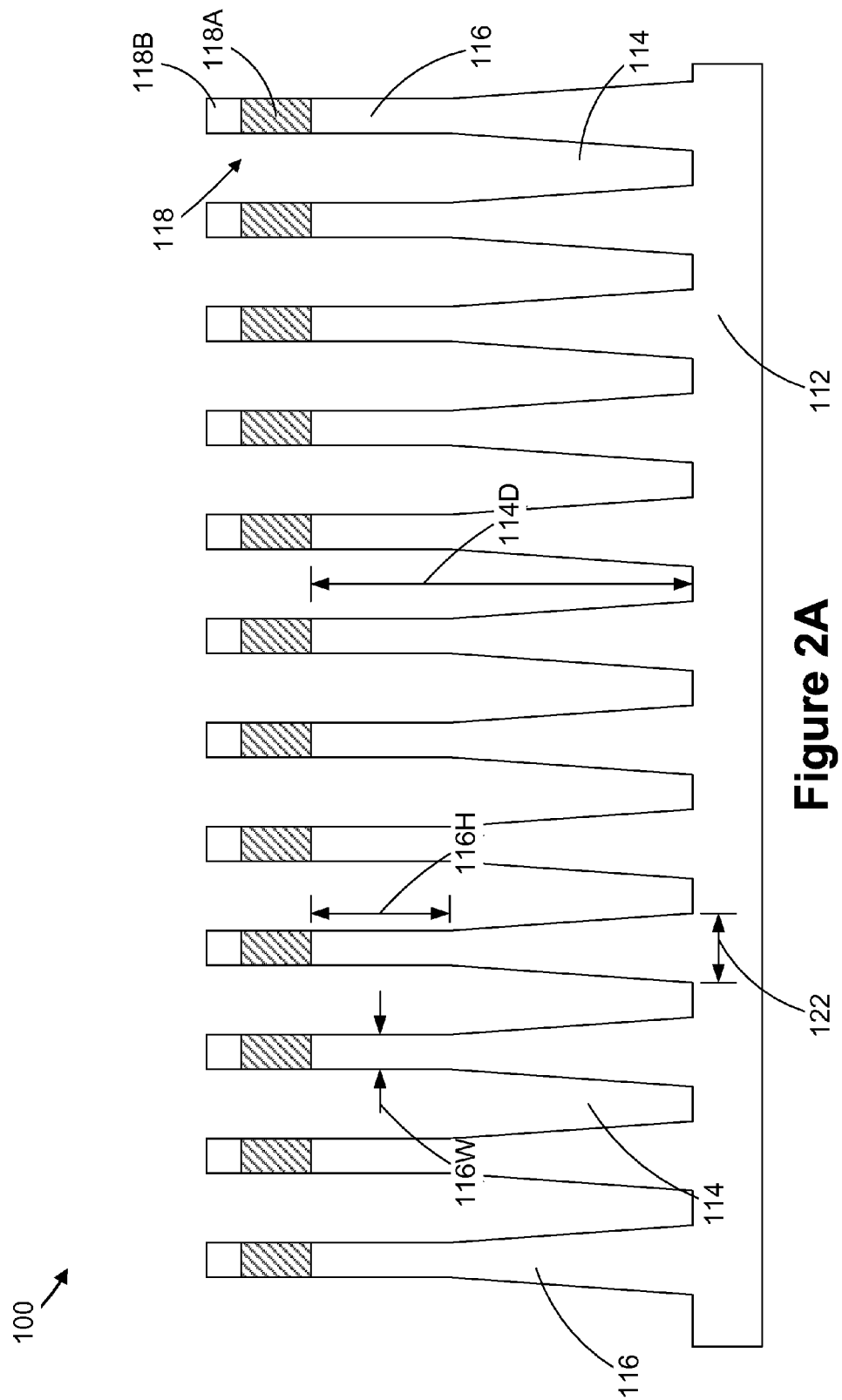

FIGS. 2A-2F depict one illustrative embodiment of a method disclosed herein of forming isolation structures and fins on a FinFET semiconductor device 100 that is formed on a bulk semiconducting substrate 112. FIG. 2A is a simplified view of an illustrative FinFET semiconductor device 100 at an early stage of manufacturing. As will be recognized by those skilled in the art after a complete reading of the present application, the illustrative FinFET device 100 described herein may be either an N-type FinFET device or a P-type FinFET device. In this illustrative embodiment, the substrate 112 has a bulk semiconducting material configuration. The substrate 112 may be made of silicon or it may be made of materials other than silicon. Thus, the terms "substrate" or "semiconducting substrate" should be understood to cover all forms of all semiconductor materials.

FIG. 2A depicts the device 100 after one or more trench-formation etching processes have been performed through a patterned hard mask layer 118 to define a plurality of trenches 114 in the substrate 112. The trenches 114 define a plurality of fins 116, i.e., a "sea-of-fins." The patterned mask layer 118 is intended to be representative in nature as it may be comprised of a variety of materials, such as, for example, a photoresist material, silicon nitride, silicon oxynitride, etc. Moreover, the patterned mask layer 118 may be comprised of multiple layers of material, such as, for example, a silicon nitride layer 118A and a layer of silicon dioxide 118B. The patterned mask layer 118 may be formed by depositing the layer(s) of material that comprise the mask layer 118 and thereafter directly patterning the mask layer 118 using known photolithography and etching techniques. Alternatively, the patterned mask layer 118 may be formed by using known sidewall image transfer techniques. Thus, the particular form and composition of the patterned mask layer 118 and the manner in which it is made should not be considered a limitation of the present invention. In the case where the patterned mask layer 118 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application.

As indicated above, one or more trench-formation etching processes, such as a plurality of dry or wet etching processes, are performed through the patterned mask layer 118 to form the trenches 114. These etching processes result in the definition of a plurality of overall fin structures 116. The overall size, shape and configuration of the trenches 114 and the fin structures 116 may vary depending on the particular application. The depth 114D of the trenches 114 may vary depending upon the particular application. In one illustrative embodiment, based on current-day technology, the depth 114D of the trenches 114 may range from approximately 100-300 nm. In some embodiments, the fins 116 may have a width 116W within the range of about 6-12 nm. In the illustrative example depicted in the attached figures, the trenches 114 and the fins 116 are all of a uniform size and shape. However, such uniformity in the size and shape of the trenches 114 and the fins 116 is not required to practice at least some aspects of the inventions disclosed herein. In the example depicted herein, the trenches 114 are depicted as having been formed by performing a plurality of anisotropic etching processes. In some cases, the trenches 114 may have a reentrant profile near the bottom of the trenches 114. To the extent the trenches 114 are formed by performing a wet etching process, the trenches 114 may tend to have a more rounded configuration or non-linear configuration as compared to the generally linear configurations of the trenches 114 that are formed by performing an anisotropic etching process. Thus, the size and configuration of the trenches 114, and the manner in which they are made, should not be considered a limitation of the present invention.

Figure 2B:
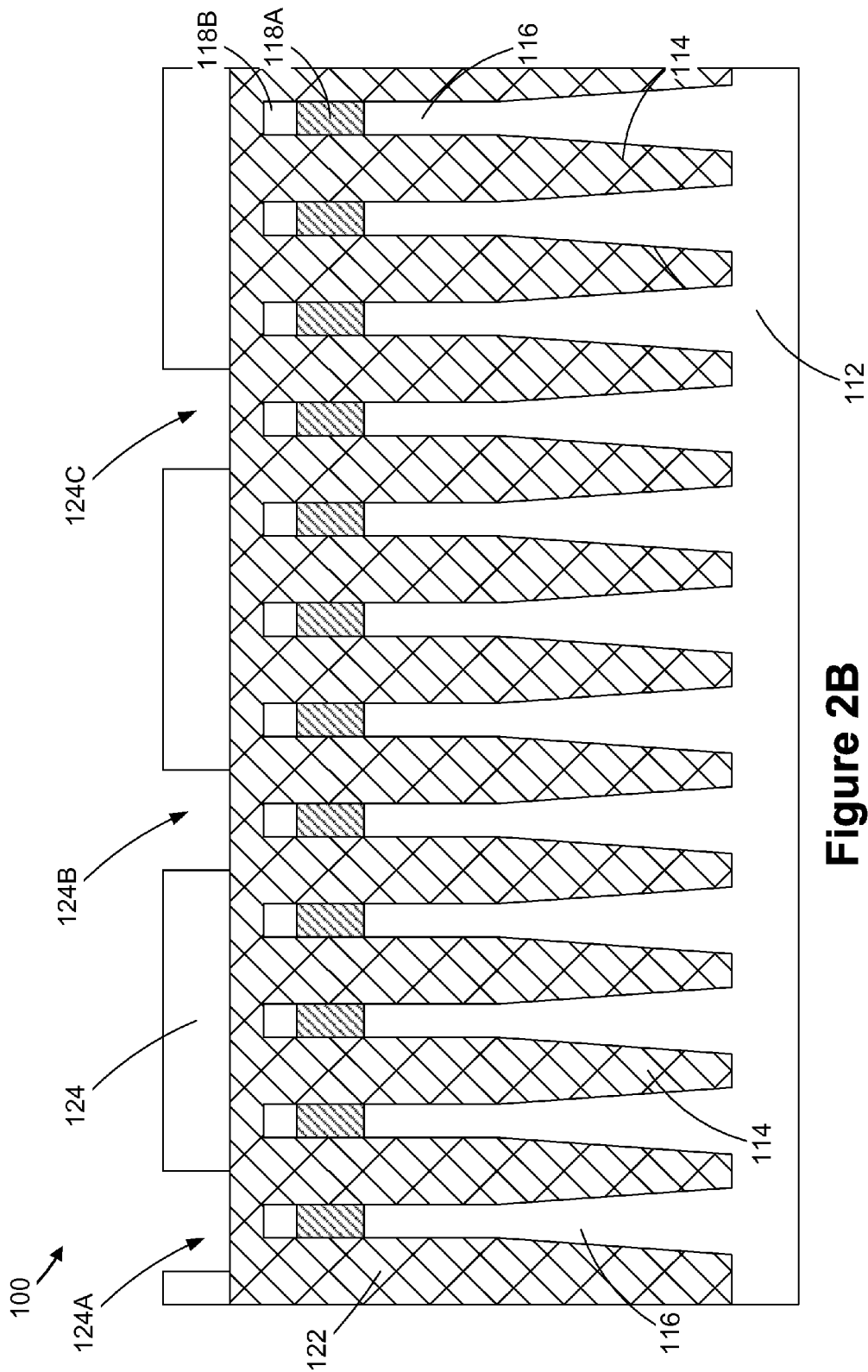

FIG. 2B depicts the device 100 after several process operations have been per formed. Initially, in this illustrative embodiment, an overfill material layer 122 is formed so as to overfill the trenches 114. As will be recognized by those skilled in the art after a complete reading of the present application, the inventions disclosed herein may be employed where a variety of materials may be used to overfill the trenches 114 at this stage of the process flow. In one illustrative embodiment, the overfill material layer 122 may be comprised of one of the DUO brand materials sold by Honeywell under the names DUO™ 248, DUO™ 193 or a spin-on-glass (SOG) material.

In some cases, an additional OPL and ARC layer or a protection layer may be formed above such an overfill material, however, in the case where the illustrative overfill material layer 122 is made of DUO, a separate ARC layer may not be required. Thus, the present invention should not be considered to be limited to any particular type of material used to overfill the trenches 114 unless such a material is expressly recited in the claims. In the case where the overfill material layer 122 is made of a DUO material, it may be formed by performing a spin-coating process and it may have a thickness of about 50-200 nm.

With continuing reference to FIG. 2B, a patterned mask layer 124, e.g., a patterned photoresist mask, is formed on the overfill material layer 122. The mask layer 124 has a plurality of openings 124A-124C positioned above a subset of the fins 116 that are to be removed. In the depicted example, the subset of the fins to be removed contains only a single fin that will be removed to make room for the isolation region. However, as will be recognized by those skilled in the art, depending upon the desired final size of the isolation region, more than one fin 116 may be in the subset of the fins 116 to be removed.

Figure 2C:
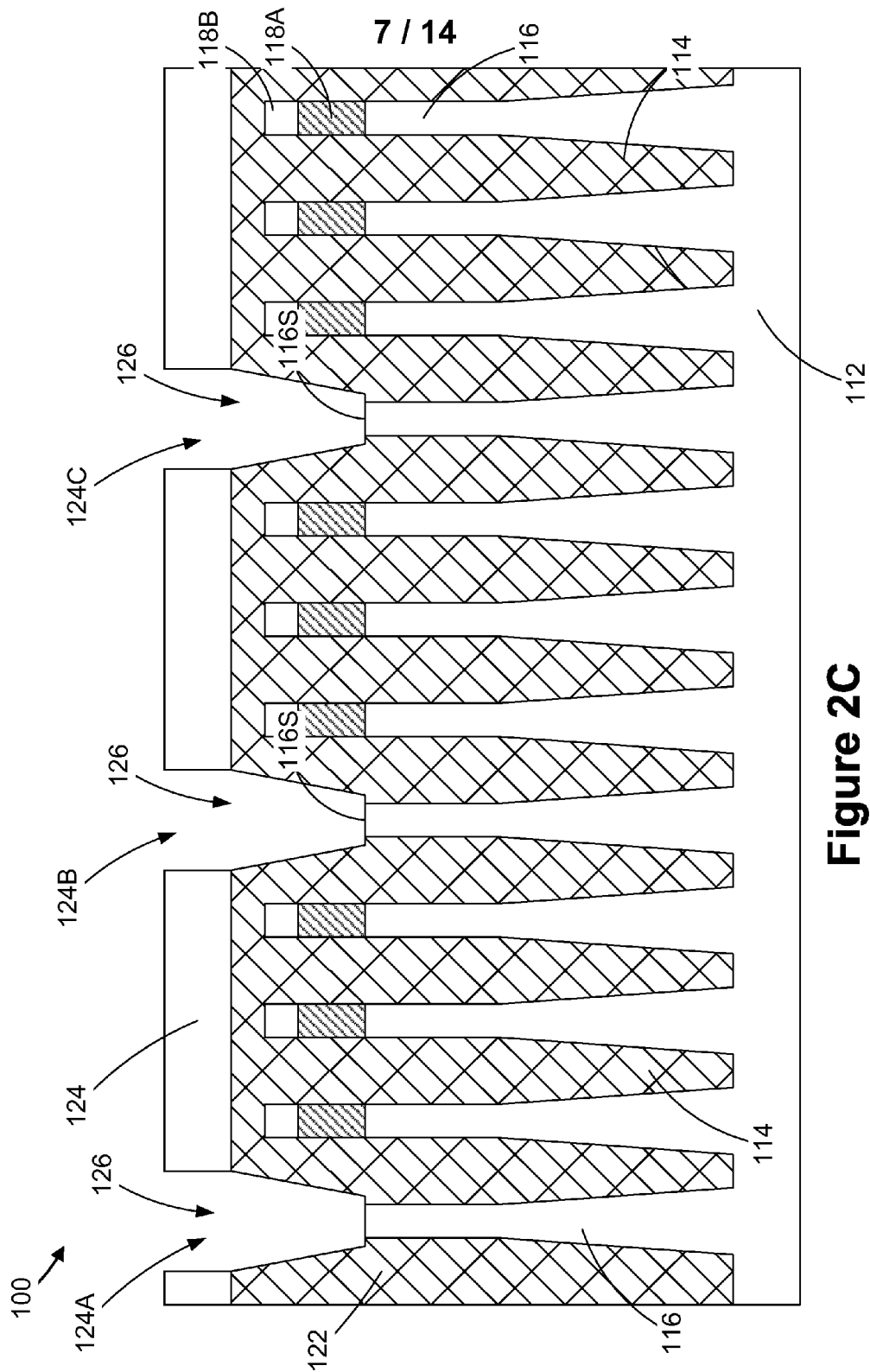

Next, as shown in FIG. 2C, one or more dry fin-exposure etching processes are performed through the masking layer 124 to define a plurality of cavities 126 that expose the upper surface 116S of the underlying fins 116 in the subset of fins to be removed. In the depicted example, the fin-exposure etching processes remove underlying portions of the overfill material layer 122 and the hard mask layer 118.

Figure 2D:
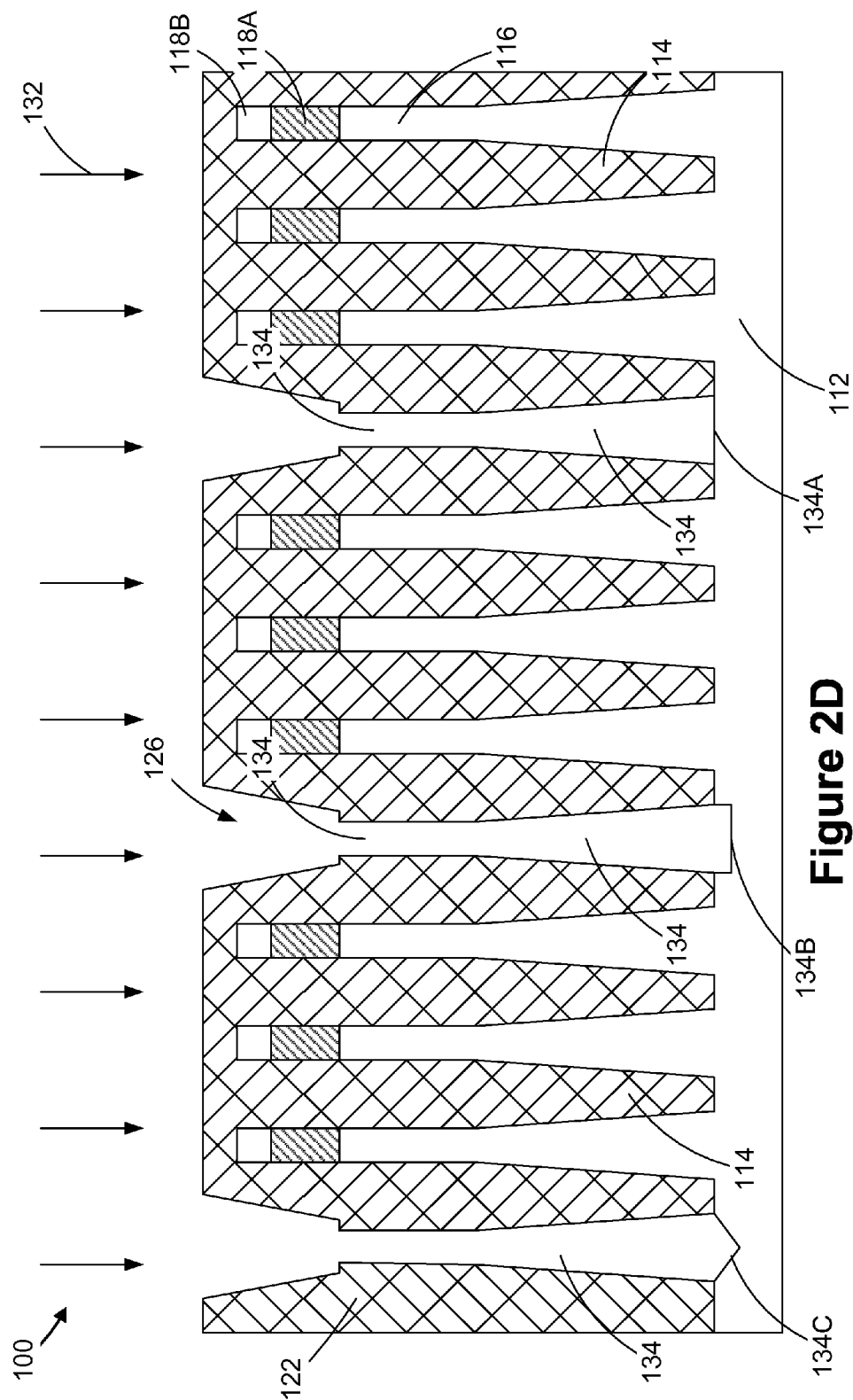

FIG. 2D depicts the device 100 after several process operations have been per formed. First, the patterned mask layer 126 was removed. Thereafter, a dry or wet etching process 132 was performed to remove the exposed fins 116 (that constitute the subset of the fins to be removed) selectively relative to the overfill material layer 122 and thereby define openings 134 in the overfill material layer 122. Depending upon the nature and duration of the etching process 132, portions of the underlying substrate 112 may be removed. In FIG. 2D, reference number 134A depicts the idealized situation where there is no etching of the underlying substrate 112, wherein reference numbers 134B, 134C refer to illustrative over-etch profiles that may be found in the substrate 112 when the etching process 132 is a dry or wet etching process, respectively. To the extent that there is any over-etching of the substrate 112 during the etching process 132, such over-etched regions will eventually be filled with the material that will be used to form the isolation regions on the device 100.

Figure 2E:
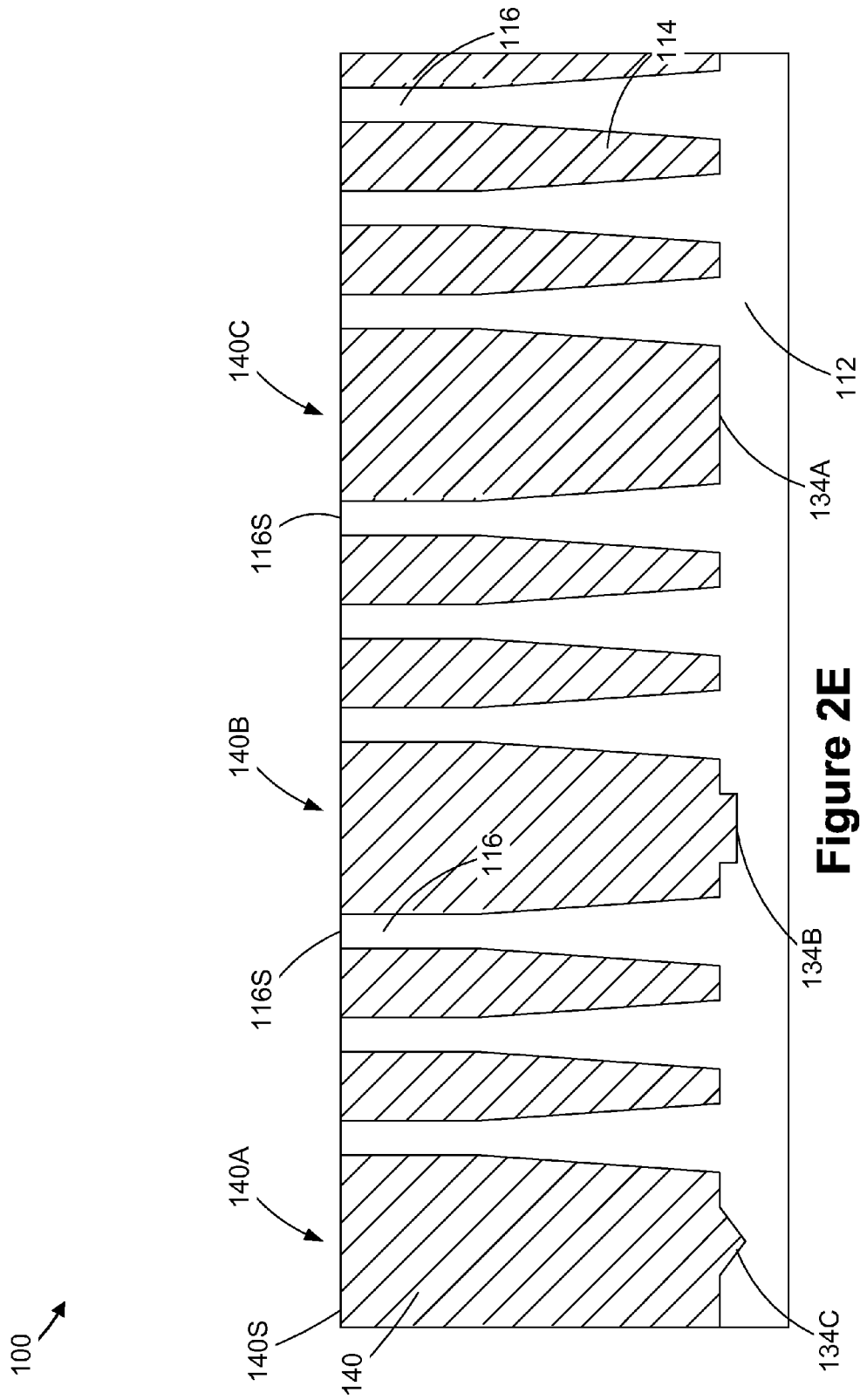

FIG. 2E depicts the device 100 after several process operations have been per formed. Initially, the overfill material layer 122 is removed by performing an etching or solvent-based stripping process depending upon the material used for the overfill material layer 122. Thereafter, a layer of insulating material 140, e.g., silicon dioxide (which may be in various deposition forms), etc., is blanket-deposited on the device 100 such that it overfills the trenches 114. FIG. 2E depicts the device 100 after one or more chemical mechanical polishing (CMP) processes have been performed to remove the patterned hard mask 118 and to planarize the upper surface 140S with the now-exposed upper surface 116S of the remaining fins 116. These process operations initially define the illustrative isolation regions 140A-140C in the areas that includes at least the area that was formerly occupied by the fins 116 that were removed from the initial "sea-of-fins."

FIG. 2F depicts the device 100 after an etching process was performed to recess the upper surface of the layer of insulating material 140 so as to effectively expose the fins 116 to their desired final fin height 116H, e.g., about 20-40 nm. At the point of fabrication depicted in FIG. 2F, traditional manufacturing operations may be performed to complete the fabrication of the FinFET device 100, e.g., gate formation, source/drain implants, fin epi, contact formation, etc.

FIGS. 3A-3E depict one illustrative embodiment of a method disclosed herein of forming isolation structures and fins on a FinFET semiconductor device 101 that is formed on an SOI substrate 150. The SOI substrate 150 is generally comprised of a bulk substrate 150A, a buried insulation layer 150B and an active layer 150C. The illustrative FinFET device 101 is formed in and above the active region 150C.

Figure 3A:
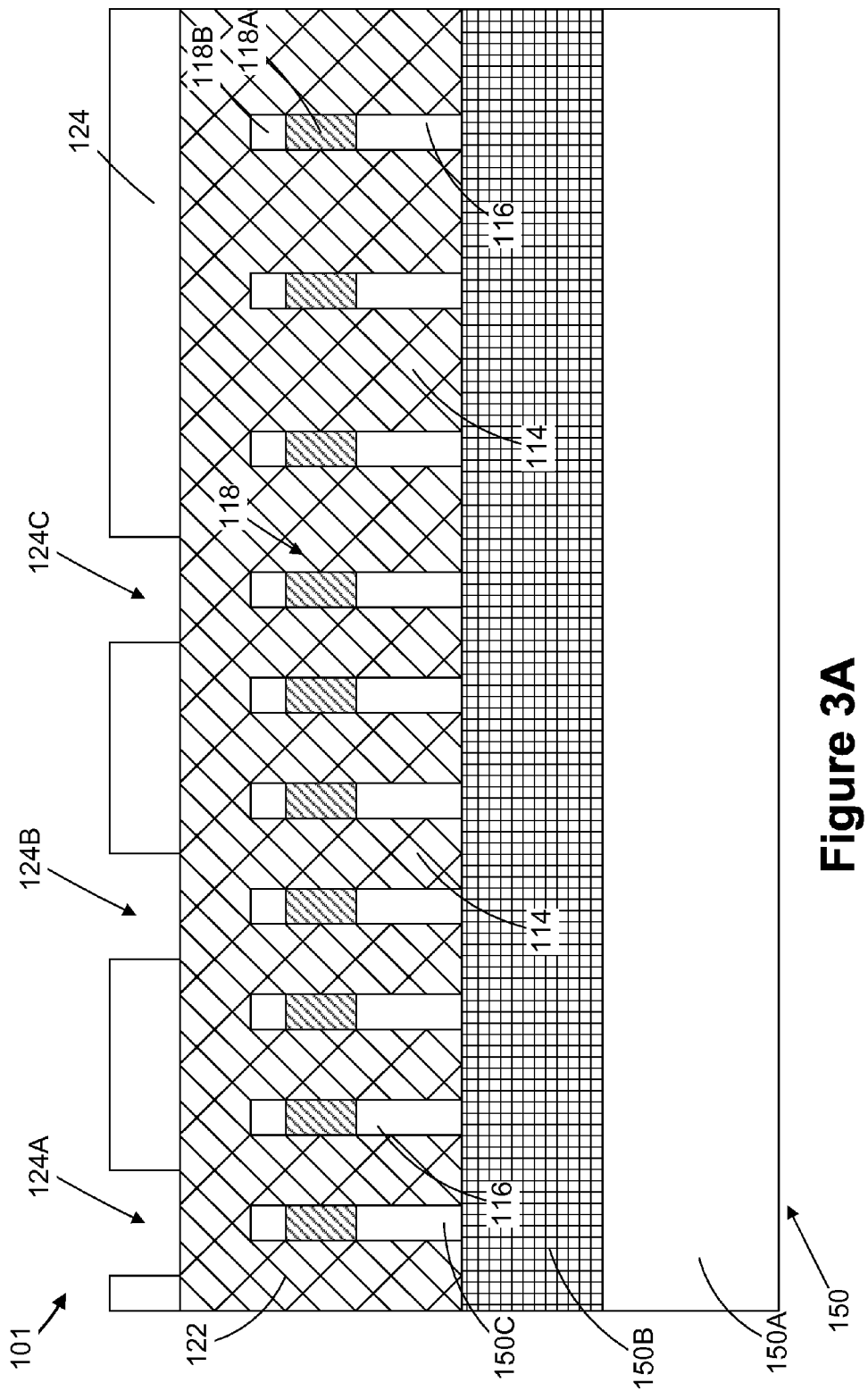
FIGS. 3A-3D depict one illustrative embodiment of a method disclosed herein of forming isolation structures and fins on a FinFET semiconductor device that is formed on an SOI substrate.

FIG. 3A depicts the device 101 at a point of fabrication after the trench-formation etching processes were performed through the patterned mask layer 118 to form the trenches 114 that define the "sea-of-fins" 116. In this example, there are regions of the substrate 150 wherein the fins 116 are formed with different fin pitches. In FIG. 3A, the layer of overfill material 122 and the patterned mask layer 124 have also been formed. The mask layer 124 has a plurality of openings 124A-124C positioned above various fins 116 that are the subset of fins that are to be removed. In the depicted example, only a single fin will be removed to make room for the isolation region. However, as noted before, depending upon the desired final size of the isolation regions, more than one fin 116 may be included in the subset of fins to be removed.

Figure 3B:
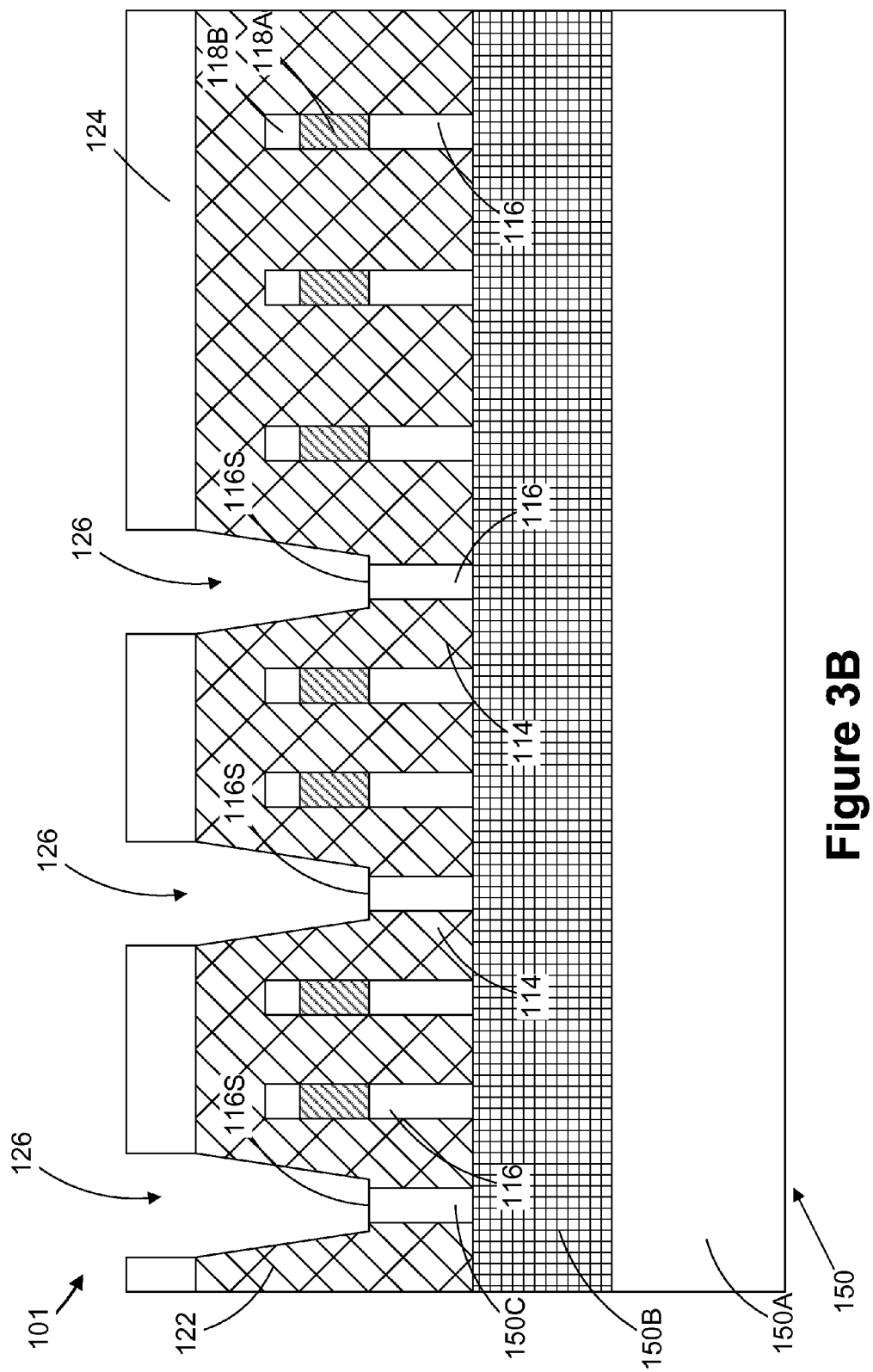
Figure 3C:
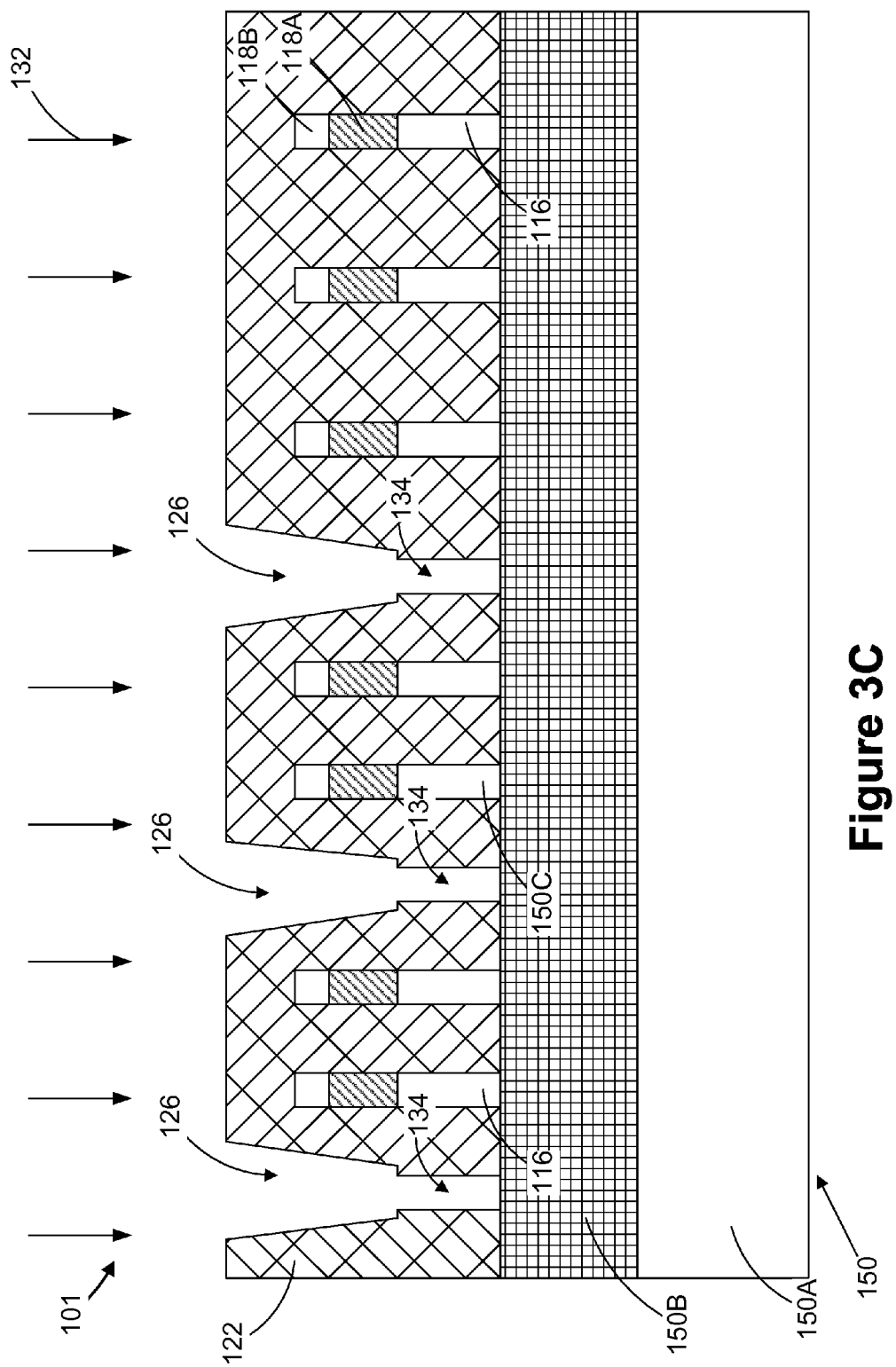

Next, as shown in FIG. 3B, one or more dry fin-exposure etching processes are performed through the masking layer 124 to define the cavities 126 that expose the upper surfaces 116S of the underlying fins 116. In the depicted example, the fin-exposure etching processes remove underlying portions of the overfill material layer 122 and the hard mask layer 118. FIG. 3C depicts the device 100 after several process operations have been performed. First, the patterned mask layer 126 was removed. Thereafter, the etching process 132 was performed to remove the exposed fins 116 selectively relative to the overfill material layer 122 and thereby define the openings 134 in the overfill material layer 122. In this embodiment, the etching process 132 stops on the underlying buried insulation layer 150B.

Figure 3D:
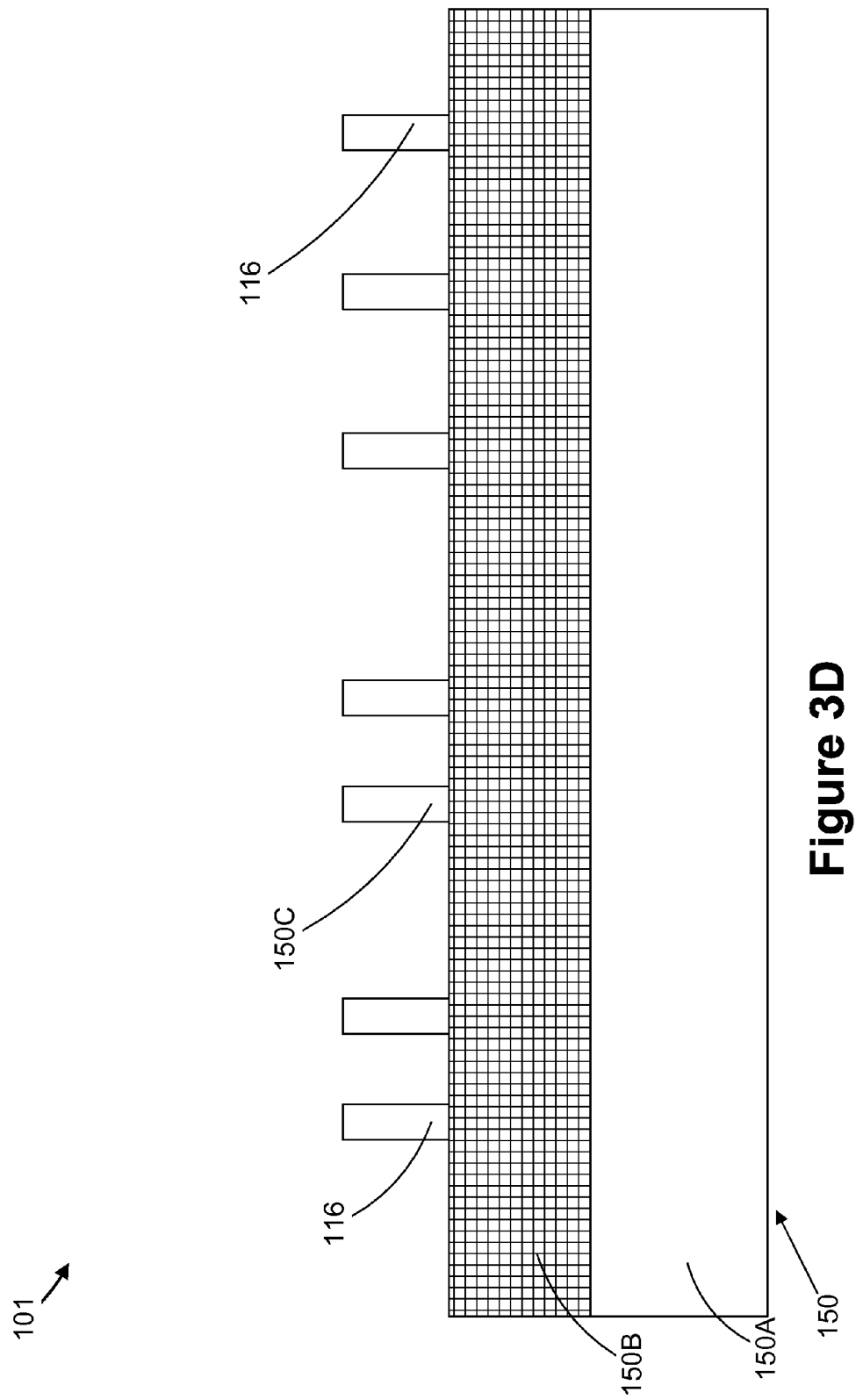

FIG. 3D depicts the device 100 after several process operations have been performed. Initially, the overfill material layer 122 was removed by performing an etching or solvent-based stripping process depending upon the material used for the overfill material layer 122. At the point of fabrication depicted in FIG. 3D, traditional manufacturing operations may be performed to complete the fabrication of the FinFET device 101, e.g., gate formation, source/drain implants, fin epi, contact formation, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a plurality of trenches in a semiconducting substrate to thereby define a plurality of fins, each of said fins having an upper surface;
forming a layer of overfill material that overfills said trenches, an upper surface of said overfill material being positioned above said upper surface of said fins;
forming a masking layer above said layer of overfill material, said masking layer having an opening that is positioned above a subset of said plurality of fins that is desired to be removed, wherein said subset of fins is comprised of at least one but less than all of said plurality of fins;
performing at least one first etching process through said masking layer to remove at least a portion of said layer of overfill material and thereby expose an upper surface of said subset of fins; and
performing at least one second etching process on said exposed surface of said subset of fins to remove said subset of fins.

2. The method of claim 1, further comprising:
removing said layer of overfill material; and
forming an isolation structure in an area that includes an area occupied by said removed subset of fins.

3. The method of claim 1, further comprising:
removing said layer of overfill material;
forming a layer of insulating material that overfills said trenches; and
performing at least one chemical mechanical polishing process on said layer of insulating material.

4. The method of claim 1, wherein said subset of fins is comprised of one of said plurality of fins.

5. The method of claim 1, wherein said layer of overfill material is comprised of at least one of DUO™ 248, DUO™ 193, amorphous carbon, spin-on carbon, or spin-on-glass.

6. The method of claim 1, wherein said semiconducting substrate is a bulk semiconducting material or a silicon-on-insulator substrate.

7. A method, comprising:
forming a patterned hard mask layer above a semiconducting substrate;
performing at least one first etching process through said patterned hard mask layer to form a plurality of trenches in said semiconducting substrate to thereby define a plurality of fins, each of said fins having an upper surface with a portion of said patterned hard mask positioned thereabove;
forming a layer of overfill material that overfills said trenches, an upper surface of said overfill material being positioned above said upper surface of said fins;
forming a masking layer above said layer of overfill material, said masking layer having an opening that is positioned above a subset of said plurality of fins that is desired to be removed, wherein said subset of fins is comprised of at least one but less than all of said plurality of fins;
performing at least one second etching process through said masking layer to remove at least a portion of said layer of overfill material and said patterned masking layer positioned above said subset of fins so as to thereby expose said upper surface of said subset of fins; and
performing at least one third etching process on said exposed surface of said subset of fins to remove said subset of fins.

8. The method of claim 7, wherein said layer of overfill material is comprised of at least one of DUO™ 248, DUO™ 193, amorphous carbon, spin-on carbon, or spin-on-glass.

9. The method of claim 7, wherein said semiconducting substrate is a bulk semiconducting material or a silicon-on-insulator substrate.

10. A method, comprising:
forming a plurality of trenches in a semiconducting substrate to thereby define a plurality of fins, each of said fins having an upper surface;
forming a layer of overfill material comprised of a DUO™ 248 or DUO™ 193 material that overfills said trenches, an upper surface of said overfill material being positioned above said upper surface of said fins;
forming a masking layer on said layer of overfill material, said masking layer having an opening that is positioned above a subset of said plurality of fins that is desired to be removed, wherein said subset of fins is comprised of at least one but less than all of said plurality of fins;
performing at least one first etching process through said masking layer to remove at least a portion of said layer of overfill material and thereby expose an upper surface of said subset of fins; and
performing at least one second etching process on said exposed surface of said subset of fins to remove said subset of fins.

11. The method of claim 10, further comprising:
removing said layer of overfill material; and
forming an isolation structure in an area that includes an area occupied by said removed subset of fins.

12. The method of claim 10, further comprising:
removing said layer of overfill material;
forming a layer of insulating material that overfills said trenches; and
performing at least one chemical mechanical polishing process on said layer of insulating material to thereby define an isolation structure.

13. The method of claim 10, wherein said semiconducting substrate is a bulk semiconducting material or a silicon-on-insulator substrate.

* * * * *